(12) United States Patent
Bellaouar et al.

(10) Patent No.: US 7,095,819 B2
(45) Date of Patent: Aug. 22, 2006

(54) DIRECT MODULATION ARCHITECTURE FOR AMPLITUDE AND PHASE MODULATED SIGNALS IN MULTI-MODE SIGNAL TRANSMISSION

(75) Inventors: Abdellatif Bellaouar, Richardson, TX (US); Charles Gore, McKinney, TX (US); Jeff D. Laster, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 722 days.

(21) Appl. No.: 10/135,997

(22) Filed: Apr. 30, 2002

(65) Prior Publication Data

US 2003/0118143 A1    Jun. 26, 2003

Related U.S. Application Data

(60) Provisional application No. 60/342,569, filed on Dec. 26, 2001.

(51) Int. Cl.
*H03D 3/24* (2006.01)
*H04L 25/49* (2006.01)

(52) U.S. Cl. ..................... 375/376; 375/294
(58) Field of Classification Search ........... 375/376, 375/327, 294, 247; 329/325; 330/149; 327/113, 327/114
See application file for complete search history.

(56) References Cited

U.S. PATENT DOCUMENTS

| | | | |
|---|---|---|---|
| 5,726,609 A | 3/1998 | Lindholm | |
| 6,008,703 A | 12/1999 | Perrott et al. | |
| 6,047,029 A | 4/2000 | Eriksson et al. | |
| 6,239,660 B1 | 5/2001 | Dekker | |
| 6,433,835 B1 * | 8/2002 | Hartson et al. | ............. 348/608 |
| 6,937,668 B1 * | 8/2005 | Sridharan et al. | ........... 375/296 |

\* cited by examiner

*Primary Examiner*—Khai Tran
(74) *Attorney, Agent, or Firm*—Ronald O. Neerings; Wade James Brady, III; Frederick J. Telecky, Jr.

(57) ABSTRACT

Multiple-mode direct phase/amplitude modulation circuitry (20) for use in a transceiver (17) of a device such as a wireless handset (10) is disclosed. The modulation circuitry (20) includes a modulation loop (36) for modulating a phase signal into a Gaussian-Minimum-Shift-Keyed (GMSK) signal for transmission in a first mode. The modulation loop (36) may include a phase-locked loop (45) with its frequency controlled by a Σ-Δ demodulation of a compensated version of the phase signal, or alternatively may produce a modulated signal from a direct digital synthesis circuit (70; 70'). An amplitude signal is converted into an analog signal and applied to a single-sideband mixer (43) for combination with a frequency multiplied version of the phase-modulated signal (GMSK(t); PH(t)), producing an amplitude and phase modulated signal for transmission in a second mode.

23 Claims, 3 Drawing Sheets

DIRECT MODULATION ARCHITECTURE FOR AMPLITUDE AND PHASE MODULATED SIGNALS IN MULTI-MODE SIGNAL TRANSMISSION

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of wireless communications, and is more specifically directed to signal modulation in such communications.

Modern advanced mobile computing devices and wireless telephone handsets are evolving from the so-called second generation (2G) technologies for wireless communications toward the capability of providing the so-called third generation (3G) wireless services. These 3G services are expected to extend current second generation voice and data services, and to include new very high bandwidth entertainment services including video and CD quality audio, interactive messaging including video and graphics, videoconferencing, video streaming, and remote control and monitoring services. These high-bandwidth services and applications of course place significant pressure on the wireless hardware, both on the transmission and receiving sides.

In addition to the differences in communications technologies between 2G and 3G wireless generations, each of the so-called generations are currently realized according to multiple broadband communications standards. Indeed, the 3G communications standard itself ("IMT-2000") defines a family of radio interfaces that are suitable for a wide range of environments. Furthermore, some wireless communications standards are extensions of 2G modulation techniques, extending the data rates of 2G standards toward the levels required for 3G communications. To further complicate this field, different regions of the world have gravitated toward different wireless communications technologies. As a result, multiple wireless communication modes are now being used, and will likely continue to be used even into the 3G class of services.

Examples of 2G communications standards include the Global System for Mobile (GSM) and General Packet Radio System (GPRS) standards. Extensions of these approaches that are evolving toward 3G services include Enhanced Data rates for GSM Evolution (EDGE), which involves an eight-level phase shift keying (8-PSK) modulation at 200 kHz channel spacing, and CDMA 2000, which is an evolution from the TIA IS-95 code division multiple access (CDMA) standard. 3G cellular techniques are expected to include the Universal Mobile Telecommunications System (UMTS) and UTRA standards. In addition to these longer range techniques, the so-called Bluetooth short-distance wireless technology is also becoming popular in the art, for communication of wireless peripheral devices and systems with computer workstations. It is contemplated that these and other wireless standards will be implemented in the industry.

This multiplicity of communications technologies makes multi-mode transceiver circuitry desirable in the art. By definition, multi-mode transceiver circuitry is capable, on its transmitter side, of receiving a baseband input signal and modulating this signal according to multiple standards or communications technologies. Similarly, multi-mode receiving circuitry may receive a signal according to any one of the multiple technologies.

Multi-mode integrated transceiver circuits are now being developed to provide single-chip (or reduced chip count) circuitry for carrying out multi-mode transmission and receipt. These integrated circuits of course themselves provide multi-mode capability, and are well-suited for use in multi-mode wireless handsets and mobile devices. In addition, the multi-mode integrated circuits provide the integrated circuit manufacturer with an efficient way of manufacturing and controlling inventory of transceiver circuits suitable for use in equipment compliant with any one of the standards.

Figure 1:
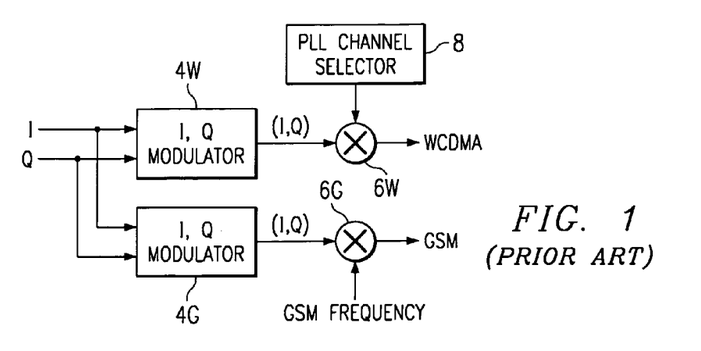
FIG. 1 is an electrical diagram, in block form, of conventional multi-mode transmitter circuitry.

FIG. 1 illustrates the construction of a conventional multi-mode transmitter. The baseband input signals to this transmitter are digital signals indicative of a signal having an amplitude and a phase, and thus are in a polar coordinate form. Typically, the amplitude and phase values for a given symbol correspond to a point in a signal constellation, such as used in quadrature amplitude modulation (QAM). In this conventional arrangement, modulation of the baseband polar signals for multi-mode transmission involves the separate modulation of the baseband signals for each of the transmission modes. In this example, where GSM and WCDMA modes are to be generated, the in-phase and quadrature (I, Q) input digital signals are applied, for each symbol, to corresponding in-phase and quadrature modulators 4W, 4G, respectively. Modulators 4W, 4G generate in-phase and quadrature (I, Q) analog signals corresponding to the received input baseband symbols, and according to the particular constellation for the corresponding transmission mode.

The I and Q output signals from modulators 4W, 4G are then applied to corresponding mixers 6W, 6G to generate the output signals, directly upconverted to the appropriate carrier frequencies. In the case of mixer 6W for generating the WCDMA signals, the corresponding channel selection is made by way of phase-locked loop 8, to generate the carrier frequencies for each of the subchannels to be transmitted. The WCDMA signals generated by mixer 6W is an amplitude and phase modulated signal over a spread spectrum. The GSM signals generated by mixer 6G is effectively a phase-modulated signal, such as a Gaussian-Minimum-Shift-Keyed (GMSK) signal at the desired carrier frequency.

The conventional multi-mode transmitter of FIG. 1 is effective to generate multiple transmission mode signals from the input baseband signal. However, according to this architecture, each transmission mode has its own amplitude and phase modulator circuitry, because of the disparity among the various modulation schemes. This multiplication of circuitry of course results in relatively costly transceivers.

By way of further background, U.S. Pat. No. 6,047,029 describes a phase-locked loop modulator in which the data signal is applied to a $\Sigma\Delta$ (or $\Sigma$-$\Delta$) modulator, the output of which controls a frequency divider in a phase-locked loop. The output of the phase-locked loop is a phase-modulated RF signal.

By way of still further background, U.S. Pat. No. 6,008,073 describes a phase-locked loop modulator in which digital modulation compensation for the effects of the low-pass loop filter is carried out. According to this approach, a digital pre-filter enhances higher frequencies of the modulating input signal, beyond the cutoff frequency of the loop filter, to compensate for the attenuation of these frequencies by the loop filter.

BRIEF SUMMARY OF THE INVENTION

It is therefore an object of the present invention to provide a multi-mode transceiver in which the transmission modulation circuitry is shared among the multiple modes.

It is a further object of the present invention to provide such a transceiver in which modulation into in-phase and quadrature components can be avoided.

It is a further object to provide such a transceiver that utilizes a transmit loop architecture to resulting low noise in the receiver band.

Other objects and advantages of the present invention will be apparent to those of ordinary skill in the art having reference to the following specification together with its drawings.

The present invention may be implemented into multi-mode transmit circuitry of wireless or mobile transceivers. According to this invention, an amplitude and phase direct modulator receives phase and amplitude signals, for example in the form of digital words. A transmit modulation loop modulates the phase signal into a phase-modulated signal for a first transmission mode, an example of which is Gaussian-Minimum-Shift-Keyed (GMSK) modulation such as is currently used according to the GSM standard. This phase-modulated signal has its frequency upconverted to correspond to that of a second transmission mode, and is mixed with an analog version of the corresponding digital amplitude signal, to produce the amplitude and phase-modulated signal, for example according to the UMTS or EDGE standards.

DETAILED DESCRIPTION OF THE INVENTION

The present invention will be described in connection with an example of its implementation in a wireless handset. It is contemplated that this invention is particularly well-suited for use in such an application. However, it is also contemplated that this invention will be of similar benefit in many other applications, particularly those involving multi-mode wireless communication. Examples of such other applications include mobile computing devices and the like. It is therefore to be understood that these and other alternatives to the embodiments described below are contemplated to be within the scope of the invention as claimed.

Figure 2:
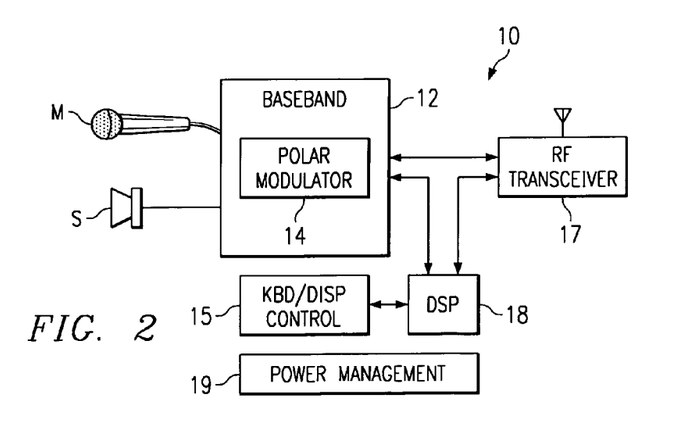
FIG. 2 is an electrical diagram, in block form, of a wireless handset constructed according to the preferred embodiment of the invention.

FIG. 2 illustrates the construction of wireless handset 10, within which the preferred embodiment of the invention is incorporated. According to this exemplary construction, baseband circuitry 12 is connected to microphone M and speaker S to receive and output audio signals from and to the human user of handset 10. In modern wireless handsets, baseband circuitry 12 includes both analog and digital circuitry for processing these user signals. For example, baseband circuitry 12 will include conventional analog amplifiers, and voice-band and radio-frequency coder/decoder ("codec") circuits for encoding and decoding into the form desired for modulation on the transmit side, and for output to the user on the receive side. According to this embodiment of the invention, baseband circuitry 12 also includes polar modulator circuitry 14, which receives encoded signals from within baseband circuitry 12 and, on the transmit side, modulates these encoded signals into digital phase and amplitude signals for application to RF transceiver 17. As known in the art, GSM transmission utilizes Gaussian Minimum Shift-Keyed Modulation (GMSK), which is a derivative of minimum shift keying (MSK), which itself is a special type of continuous phase-frequency shift keying. For other transmission modes, other types of phase-modulated, or shift-keyed, input signals may be generated by baseband circuitry 12 and may be used in connection with this invention.

Baseband circuitry 12 is controlled, in this example, by digital signal processor (DSP) 18. DSP 18 may be implemented as a conventional digital signal processor available in the art, for example a member of the TMS320c5x or TMS320c6x families of digital signal processors available from Texas Instruments Incorporated, having capability for carrying out the necessary digital operations in handset 10. In particular, it is contemplated that DSP 18 may perform a significant amount of digital filtering of the data signals processed by baseband circuitry 12. DSP 18 also supports some of the support functions of handset 10, including input and output via keyboard and display control circuit 15, particularly in the case of 3G wireless services, in which the payload signals may also include higher complexity signals such as computer and video data. Handset 10 also includes power management circuitry 19, including such functions as integrated power supplies, low dropout voltage regulators, power supply voltage supervision, battery and temperature monitoring and the like.

While baseband circuitry 12 interfaces with the human user of handset 10, RF transceiver 17 interfaces with the wireless radio transmission and receipt of communications. RF transceiver 17 includes the necessary circuitry for generating the modulated signals for transmission via the antenna, for communication with the wireless communications network. Portions of the transmit side of RF transceiver 17 according to this invention will be described in further detail below. On the receive side, RF transceiver 17 communicates the received communications, after the necessary demodulation, to DSP 18 for forwarding to baseband 12 after the appropriate decoding and filtering.

Figure 3:
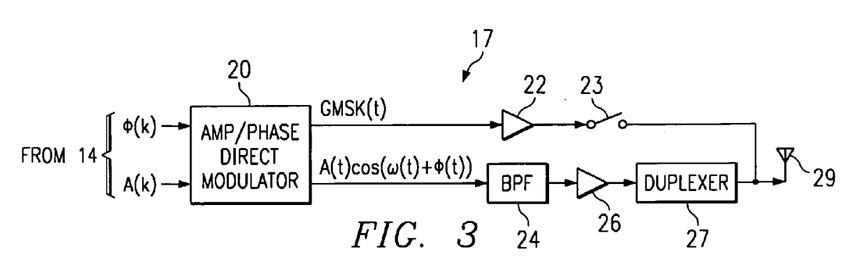
FIG. 3 is an electrical diagram, in block form, of transmit circuitry in the wireless handset constructed according to the preferred embodiment of the invention.

FIG. 3 illustrates the construction of certain functions in the transmit side of RF transceiver 17 according to the preferred embodiment of the invention. According to this invention, RF transceiver 17, and thus handset 10 generally, is capable of carrying out multi-mode transmission, so that communications can be effected via any one of multiple transmission modes that may be available in the user's area. The manner in which this multi-mode modulation and transmission is carried out according to this invention is particularly advantageous in providing a low-cost and efficient generation of the transmitted signals.

As shown in FIG. 3, amplitude/phase direct modulator 20 receives phase signal $\phi(k)$ and amplitude signal $A(k)$ at its inputs. Referring back to FIG. 2, these phase and amplitude signals $\phi(k)$, $A(k)$ are generated by polar modulator 14 in baseband circuitry 12 of handset 10. It is contemplated that these input phase and amplitude signals $\phi(k)$, $A(k)$ are sequences of digital words corresponding to the phase and amplitude of a sequence of symbols to be transmitted, and generated according to the particular transmission mode being used. Amplitude/phase direct modulator 20 generates modulated signals corresponding to these input symbols, and according to the selected one of multiple available transmission modes. In this example shown in FIG. 3, in one mode amplitude/phase direct modulator 20 generates RF phase-modulated signal GMSK(t), which for example may be a Gaussian-Minimum-Shift-Keyed signal corresponding to the GSM standard, based upon the input phase signal $\phi(k)$. In this mode, signal GMSK(t) is applied to amplifier 22 which drives antenna 29, via switch 23. In another mode, amplitude/phase direct modulator 20 produces an RF signal $A(t)(\cos \omega(t)+\phi(t))$, which is both amplitude and phase modulated, such as used in modern wireless communications standards such as UMTS, EDGE, and the like, based upon both the input phase signal $\phi(k)$ and the input amplitude signal $A(k)$. In this mode, signal $A(t)(\cos \omega(t)+\phi(t))$ is filtered by band-pass filter 24, boosted by amplifier 26, and drives antenna 29 by way of duplexer 27.

Figure 4:
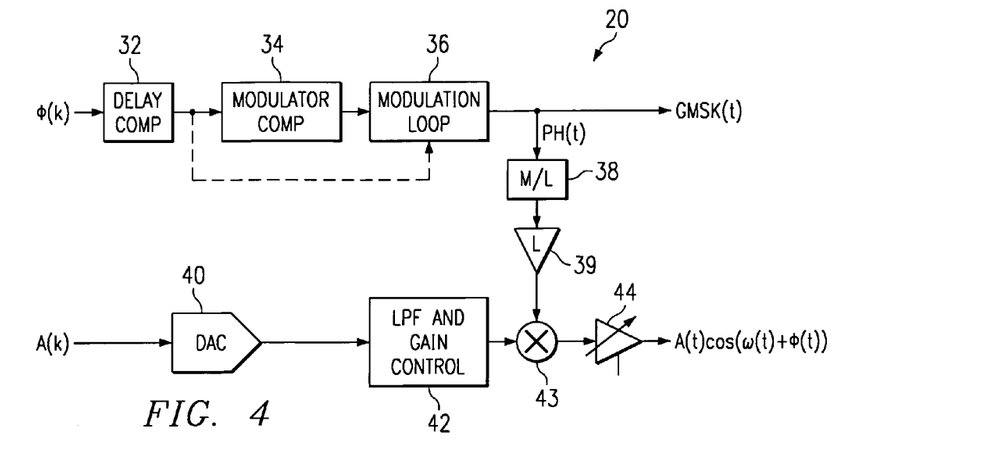
FIG. 4 is an electrical diagram, in block form, of amplitude and phase direct modulation circuitry in the transmit circuitry of FIG. 3 according to the preferred embodiment of the invention.

FIG. 4 illustrates the construction of amplitude/phase direct modulator 20 according to the preferred embodiment of the invention. As illustrated in FIG. 4, amplitude/phase direct modulator 20 includes a leg that modulates input phase signal $\phi(k)$ to produce the output signal GMSK(t) in the case of GSM communications. For other transmission modes, this path modulates input phase signal $\phi(k)$ to produce a signal PH(t) that is applied to the second leg for mixing with the input amplitude signal $A(k)$, by single-sideband mixer 43, to produce the output signal $A(t)(\cos \omega(t)+\phi(t))$.

Input phase signal $\phi(k)$ is received by delay compensation network 32. Delay compensation network 32 is effectively a digital process applied to input phase signal $\phi(k)$ to compensate for the difference in propagation delay in the paths to SSB mixer 43 traveled by input phase signal $\phi(k)$ and input amplitude signal $A(k)$. Delay compensation network 32 thus ensures that the processed versions of the input signals $\phi(k)$ and $A(k)$ for the same symbol arrive at SSB mixer 43 at the same time. Delay compensation network 32 is preferably carried out by a digital signal processor, such as DSP 18 (FIG. 2).

Modulation compensation network 34 processes the delay-compensated input phase signal $\phi(k)$, and forwards its output to modulation loop 36. As will be described in detail below, modulation loop 36 according to the preferred embodiments of the invention includes a loop filter. If the loop bandwidth has a narrow characteristic, and if the modulation bandwidth is large, modulation compensation network 34 pre-compensates this signal, in a manner to be described in detail below.

Modulation loop 36 modulates pre-compensated input phase signal $\phi(k)$ into a GMSK signal GMSK(t) in the GSM mode, or into a phase-modulated signal PH(t) in other transmission modes. As known in the art, the input phase signal $\phi(k)$ According to the preferred embodiment of the invention, modulation loop 36 is of the transmit-loop architecture, which may be realized according to various implementations, two examples of which will now be described.

Figure 5:
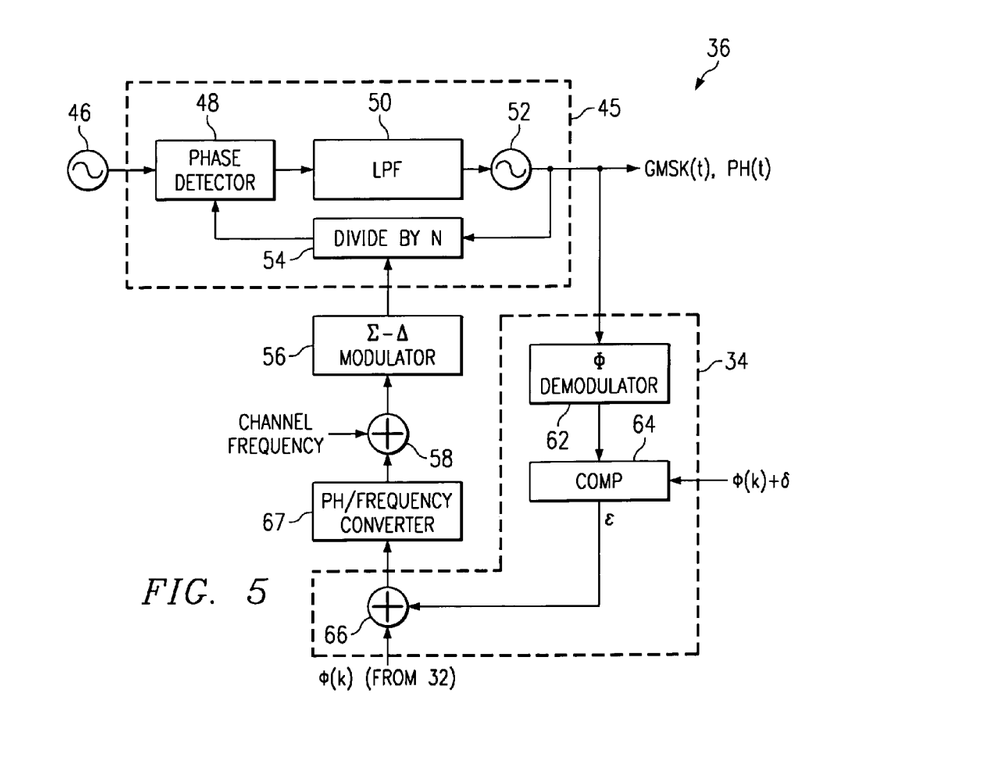
FIG. 5 is an electrical diagram, in block form, of one implementation of the modulation loop in the amplitude and phase direct modulation circuitry of FIG. 4 according to the preferred embodiment of the invention.

FIG. 5 illustrates the construction of a first implementation of modulation loop 36, in combination with modulation compensation network 34, according to the preferred embodiment of the invention. As shown in FIG. 5, modulation loop 36 includes phase-locked loop 45 for generating the modulated signal. PLL 45 includes reference oscillator 46, which produces a periodic reference signal that is applied to one input of phase detector 48 along with a feedback signal. The output of phase detector is filtered by low-pass loop filter 50, to produce an output that is applied to voltage-controlled oscillator 52. The output of VCO 52 is applied to frequency divider 54, which in turn drives the feedback signal applied to phase detector 48, completing the phase-locked loop. As shown in FIG. 5, the output of VCO 52 also drives the modulated signal GMSK(t) or PH(t), depending on the mode. This output signal GMSK(t) or PH(t) thus has a frequency that is at the frequency of reference oscillator 46 multiplied by the division factor of frequency divider 54. Control of frequency divider 54 therefore controls the frequency and phase of the output signal GMSK(t), PH(t).

As shown in FIG. 5, delay-compensated input phase signal $\phi(k)$ is applied to one input of adder 66 in compensation network 34, which receives an error signal $\epsilon$ output from comparator 64 at another input. The output of adder 66 is applied to phase-frequency converter 67, which converts the phase sum signal from adder 66 into an instantaneous frequency signal for application to adder 58, along with an offset signal on line CHNL FRQ that selects the desired channel selection of the output signal. Alternatively, modulation compensation network 34 may operate in the frequency domain, in which case adder 66 would add a delay-compensated frequency signal to the output of modulation compensation network 34 to produce a sum signal, without requiring converter 67. The sum of offset CHNL FRQ and the converted sum from adder 67 is then applied to $\Sigma$-$\Delta$ modulator 56. $\Sigma$-$\Delta$ modulator 56 is a conventional modulation circuit or function that generates an oversampled output bitstream that corresponds to an input signal. Typically, this bitstream is an oversampled bitstream, producing a multiple bit output. This output bitstream has a spectrum corresponding to that of the input analog signal, with the addition of some quantization noise as known in the art. In this embodiment of the invention as shown in FIG. 5, this output bitstream is applied to frequency divider 54, to control the generation of output modulated signal GMSK(t) in GSM mode, or PH(t) in other modes, according to the input phase signal $\phi(k)$ that is applied to the modulation loop.

According to this preferred embodiment of the invention, modulation compensation network 34 compensates for the effects of the low-pass loop filter 50 in the phase-locked loop of modulation loop 36. As evident from the foregoing description, the output signal is intended to be of relatively high RF frequency. However, the low pass loop filter 50 in modulation loop 36 limits the ability of modulation loop 36 to faithfully produce the high frequency output. According to this embodiment of the invention, therefore, modulation compensation network 34 compensates for the effects of loop filter 50, enabling modulation to be carried out at a significantly higher bandwidth than would otherwise be provided.

As shown in FIG. 5, phase compensation network 34 includes phase demodulator 62, which receives the output phase-modulated signal GMSK(t), PH(t) from the output of VCO 52. Phase demodulator 62 effectively recovers an estimate of the input phase signal $\phi(k)$ by reversing the modulation process of the phase-locked loop, producing an analog signal corresponding to the output of modulation loop 36. This analog estimate is applied to one input of comparator 64. A second input to comparator 64 is input phase signal $\phi(k)$ itself, delayed by an amount $\delta$ corresponding to the propagation delay of the input phase signal $\phi(k)$ through phase-locked loop 45 and demodulator 62.

Comparator 64 produces an error signal $\epsilon$ that corresponds to the difference between the actual input phase signal $\phi(k)$ and the output modulated signal GMSK(t), PH(t). While there are several sources of error that may be encompassed within error signal $\epsilon$, it is contemplated that the largest source of such error is that caused by the low-pass characteristic of loop filter 50, considering that the modulating input phase signal $\phi(k)$ has a bandwidth that may well exceed the loop bandwidth of PLL 45. This error signal $\epsilon$ is applied to a negative input of adder 66, to adjust the input phase signal $\phi(k)$ for the effects of modulation loop 36.

It is contemplated that modulation compensation network 34 according to this embodiment of the invention is particularly beneficial, considering that it is a relatively simple and efficient analog approach to providing such compensation. Alternatively, modulation compensation network 34 may also be implemented digitally, for example by including a digital comparator for generating a digital error signal in response to a comparison of digital representations of the input phase signal and the output modulated signal. In either case, modulation compensation network 34 uses an actual measurement of the modulated output signal in the generation of its compensating error signal $\epsilon$. In contrast, conventional digital techniques, such as described in the above-referenced U.S. Pat. No. 6,008,073 rely upon a priori determination of the low-pass loop filter 50 characteristic, and thus risk inaccuracies in the compensation.

In summary, modulation loop 36 of FIG. 5 according to this exemplary implementation controls the frequency and phase of the modulated output signal GMSK(t) by controlling the value of frequency divider 54. This control of the instantaneous frequency of the output signal is based upon the input phase signal $\phi(k)$, compensated by modulation compensation network 34 according to a comparison of a demodulation of the output signal and the input signal itself, and offset by a channel selection value on line CHNLFRQ. The control signal is generated by a $\Sigma$-$\Delta$ modulator 56, applied to the compensated modulating signal.

Figure 6:
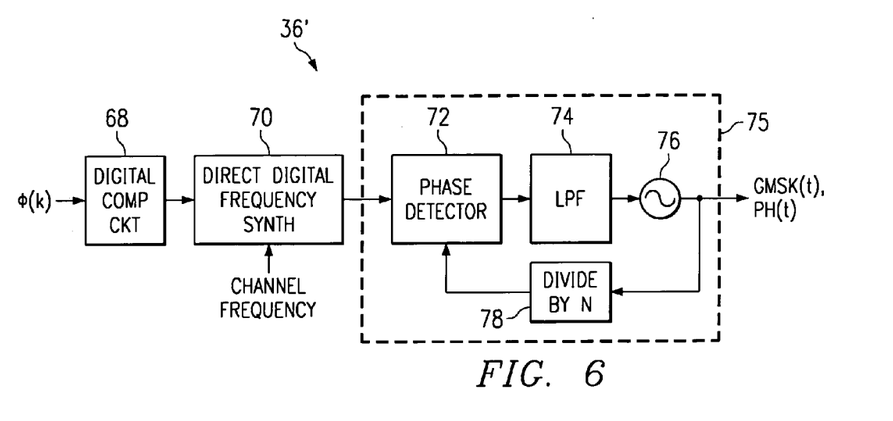
FIG. 6 is an electrical diagram, in block form, of an alternative implementation of the modulation loop in the amplitude and phase direct modulation circuitry of FIG. 4 according to the preferred embodiment of the invention.

According to the preferred embodiment of the invention, modulation loop 36 may be realized according to alternative approaches. FIG. 6 illustrates modulation loop 36' constructed according to an alternative implementation of the preferred embodiment of the invention.

As shown in FIG. 6, digital compensation circuit 68 of modulation loop 36' receives input phase signal $\phi(k)$ from polar modulator 14 in baseband circuitry 12. As discussed above, loop filters in phase-locked loops can affect the frequency response of modulation; because modulation loop 36' according to this embodiment of the invention includes phase-locked loop 75 (including loop low-pass filter 74) as shown in FIG. 6, digital compensation circuit 68 compensates for the effects of this filtering. It is contemplated that those skilled in the art having reference to this description will be readily able to derive the appropriate digital compensation in this realization, for example by way of a software routine executed by a DSP.

The compensated output of digital compensation circuit 68 is then applied to direct digital frequency synthesis (DDS) circuit 70. DDS circuit 70 generates an output signal corresponding to the compensated input phase signal $\phi(k)$, at a selected carrier frequency. As such, DDS circuit 70 receives the selected channel frequency for the eventual phase-modulated signal, as shown in FIG. 6. The detailed construction of DDS circuit 70 according to alternative realizations will be described below.

The output of DDS circuit 70 is applied to phase-locked loop 75, which in turn generates the appropriate output signal GMSK(t), PH(t) at the appropriate frequency. In conventional PLL manner, PLL 75 includes phase detector 72, which receives the output of DDS circuit 70 and compares it to a frequency-divided feedback signal from divider 78. The output of phase detector 72 is filtered by low-pass loop filter 74, and applied to VCO 76 which generates output signal GMSK(t), PH(t) at its output. The output of VCO 76 is also forwarded to divider 78, for generation of the appropriate feedback signal to phase detector 72.

Figure 7:
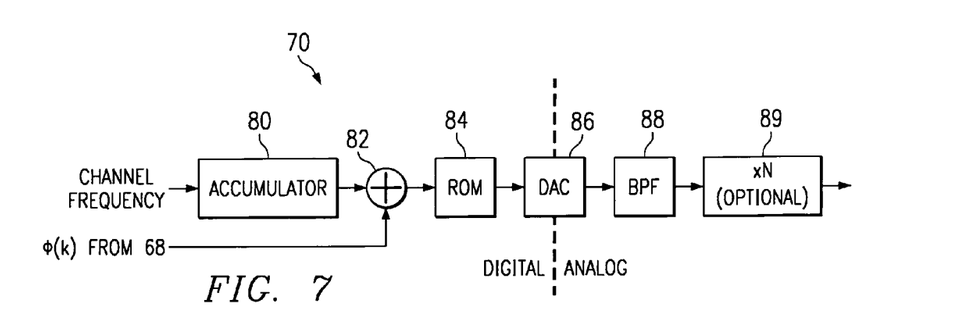
FIG. 7 is an electrical diagram, in block form, of one implementation of direct digital frequency synthesis circuitry in the modulation loop of FIG. 6 according to the preferred embodiment of the invention.

Referring now to FIG. 7, a first realization of DDS circuit 70 according to the preferred embodiment of the invention will now be described. The construction of DDS circuit 70 follows conventional DDS techniques. As shown in FIG. 7, a digital word corresponding to the selected channel frequency is applied to accumulator 80, which accumulates the digital frequency word with its prior contents at the selected channel frequency to output a digital value, which is applied to adder 82. Adder 82 adds a digital value, corresponding to the compensated input phase signal $\phi(k)$, to the time-varying contents of accumulator 80, effectively adding a phase shift corresponding to the input phase signal $\phi(k)$. The output of adder 82, which also is a digital word, is applied as an address to read-only memory (ROM 84), which outputs a corresponding digital value responsive to this address. As known in the art, ROM 84 is effectively a sine table that presents a digital value corresponding to a point on a sine wave in response to the output of adder 82. The digital sine value is applied to the input of digital-to-analog converter (DAC) 86, which in turns produces an analog signal over time, based on to the sine wave output of ROM 84.

In the analog realm of DDS circuit 70, the output of DAC 86 is filtered by band-pass filter 88 into a desired frequency band. The filtered output is then optionally multiplied in frequency by frequency multiplier 89, to produce a periodic phase-modulated analog signal that is applied to the input of PLL 75 in modulation loop 36' (FIG. 6). PLL 75 then generates the phase-lockedoutput signal GMSK(t), PH(t). As shown in FIG. 4, output signal GMSK(t) is used as an output signal itself in one or more modes (e.g., GSM), and in other modes output signal PH(t) is forwarded to the second leg of amplitude/phase direct modulator 20, for use in generating the amplitude and phase modulated signal, as will be described below.

Figure 8:
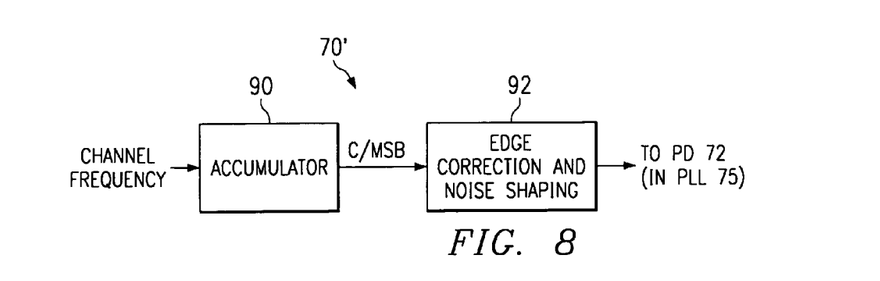
FIG. 8 is an electrical diagram, in block form, of an alternative implementation of direct digital frequency synthesis circuitry in the modulation loop of FIG. 6 according to the preferred embodiment of the invention.

FIG. 8 illustrates an alternative construction of DDS circuit 70' according to the preferred embodiment of the invention. In this realization, DDS circuit 70' includes accumulator 90, which receives a digital word corresponding to the selected channel frequency. Accumulator 90 in this realization is a simple digital wrap-around accumulator, which forwards the carry or most significant bit out to edge correction and noise shaping circuit 92. Accumulator 90 thus repeatedly adds the frequency word to its stored contents, at substantially the channel frequency, and a single bit output is then produced by accumulator 90 with each addition, depending on the carry or MSB of the current accumulation.

Edge correction and noise shaping circuit 92 is a digital function that corrects for non-integer jitter that can result from the repeated accumulation of the frequency word. Consider the simple example where accumulator 90 is a three-bit (eight-state plus carry) digital accumulator, with a carry-bit output, and where the selected digital channel frequency word is $3_{10}(011_2)$, which is added to the contents of accumulator 90 with each cycle. Accordingly, the state of accumulator 90 and its carry output will follow the rotation:

| Cycle (mod$_8$) | Contents | C$_{out}$ |
|---|---|---|
| 1 | 100 | 0 |
| 2 | 111 | 0 |
| 3 | 010 | 1 |
| 4 | 101 | 0 |
| 5 | 000 | 1 |
| 6 | 011 | 0 |
| 7 | 110 | 0 |
| 8 | 001 | 1 |
| 1 | 100 | 0 | and so on for each repetition of this sequence. This provides a sequence of bits at the an output $C_{out}$ that is at a "1" level an average of three times in every eight cycles, corresponding to the digital frequency word $011_2$. While the frequency of "1" bits in this example is accurate in the aggregate, there is significant jitter because the "1" bits are not evenly spaced within the sequence. In other words, the output sequence in this example is

00010100010001010010001 . . .

As evident from this sequence, the "1" bits are separated from one another by three "0" bits, one "0" bits, in that order. In this example, the average duty cycle is ⅜ (i.e., three "1" bits out of every eight output bits), but with significant jitter from pulse to pulse.

According to this embodiment of the invention, edge correction and noise shaping circuit 92 evenly spaces the "1" bits within the sequence, while not disturbing the average duty cycle of the output signal. According to this embodiment of the invention, edge correction and noise shaping circuit 92 includes digital circuitry for digitally synthesizing an output signal having a duty cycle corresponding to the average duty cycle of the input signal, which in this case is the carry (or MSB) output from accumulator 90. To the extent that the exact duty cycle cannot be produced by edge correction and noise shaping circuit 92, the noise shaping function randomizes the direction of the error of the output signal, for example in Σ-Δ fashion, so that digitization error does not accumulate. Considering the example described above, in which a duty cycle of "1" bits is ⅜, if these "1" bits were evenly distributed over eight clock cycles, one "1" bit would be issued every $2.\overline{66}$ clock cycles. Accordingly, edge correction and noise shaping circuit 92 will issue a "1" pulse, having a duration of one clock cycle, approximately every 2.66 clock cycles. Because of the digital implementation of edge correction and noise shaping circuit 92 according to this embodiment of the invention (not to mention that the exact frequency cannot be exactly represented by a finite number of bits), the pulses cannot be generated at exactly the correct duty cycle. According to this embodiment of the invention, therefore, noise shaping functionality randomizes the polarity of the digitization error, with some pulses generated early and some late, so that this error does not accumulate over time. As a result, an average of three "1" bits will be presented by edge correction and noise shaping circuit 92 in every group of eight clock cycles. However, according to this embodiment of the invention, the separation between adjacent "1" bits is substantially uniform, greatly reducing the jitter in this output bitstream.

It is contemplated that those skilled in the art will be readily able to construct edge correction and noise shaping circuit 92, either by way of a digital filter function implemented in a digital signal processor device, or alternatively by way of conventional digital combinatorial or sequential logic.

As shown in FIG. 8, the output of edge correction and noise shaping circuit 92 can be directly presented to phase detector 72 in PLL 75 (FIG. 6).

In each of these realizations of modulation loop 36, referring back to FIG. 4, an analog phase-shift-keyed signal is produced. According to this embodiment of the invention, the Gaussian-Minimum-Shift-Keyed signal GMSK(t) corresponds to the signal to be transmitted in some communications modes, such as GSM. As discussed above and as known in the art, other communications modes, such as UMTS and EDGE, require a signal that is both phase and amplitude modulated. According to this preferred embodiment of the invention, a phase-modulated signal PH(t) produced by modulation loop 36 is then modulated in amplitude to provide such an amplitude and phase modulated output signal for these other modes, as will now be described.

As shown in FIG. 4, phase-modulated signal PH(t) is applied to the input of frequency multiplier/divider 38, which converts the frequency of the phase-modulated signal PH(t) to a multiple M/L (M and L being integers) of that signal. The scaling factors M and L are selected to correspond to the frequency relationship of the desired carrier signal for the amplitude and phase modulated output, relative to the frequency of the phase-modulated signal PH(t). Limiter 39 then limits the amplitude of the multiplied phase-modulated signal to the desired amplitude range. The output of limiter 39, which presents phase-modulated signal PH(t) at a desired frequency and within desired amplitude limits, is then applied to one input of single-sideband mixer 43.

Amplitude modulation of the eventual amplitude and phase-modulated signal is accomplished according to input amplitude sequence A(k), which is a baseband digital bitstream corresponding to the desired amplitude modulation. This sequence A(k) is received by amplitude/phase direct modulator 20 from polar modulator 14 of baseband circuitry 12 (FIGS. 2 and 3). Digital-to-analog converter 40 converts the baseband sequence A(k) to an analog time-domain signal, which is then filtered and processed by low pass filter and gain control circuit 42, constructed in the conventional manner. The output of low pass filter and gain control circuit 42 is then applied to a second input of SSB mixer 43.

SSB mixer 43 combines the processed analog input amplitude signal A(k) with the frequency-shifted processed analog phase-modulated signal PH(t) to produce a signal that is both amplitude and phase modulated, according to the amplitude and phase modulation information generated by polar modulator 14 as signals A(k) and φ(k). This amplitude and phase-modulated signal can be mathematically represented as A(t)cos(ωt+φ(t)). The combined signal is then amplified by RF variable gain amplifier 44 to the desired levels for transmission, producing the eventual output signal A(t)cos(ωt+φ(t)), suitable for transmission via band pass filter 24, amplifier 26, duplexer 27, and antenna 29, as shown in FIG. 2.

According to this preferred embodiment of the invention, numerous advantages are provided. This embodiment of the invention provides a multi-mode RF system that can be readily implemented, without requiring conversion of the data signal into (and back from) the I/Q representation, as is required according to conventional techniques. It is contemplated that the preferred embodiment of the invention will have very low transmitter noise in the receiver band, because of the use of a transmit-loop approach for the generation of the phase-modulated signal. Additionally, the amplitude and phase modulated signal is produced without duplication of the phase-modulation, as is also necessitated by conventional designs.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A multiple-mode amplitude and phase direct modulator circuit, comprising:
   a phase modulator leg, comprising:
     compensation circuitry for applying delay compensation to an input phase signal;
     a modulation loop, for receiving the compensated input phase signal and for producing a phase-modulated output signal as a first mode output signal; and
     a frequency multiplier, coupled to the modulation loop, for multiplying the frequency of the phase-modulated output signal;
   an amplitude modulator leg, comprising:
     a digital-to-analog converter, for converting an input amplitude digital sequence to an analog amplitude modulated signal; and
   a mixer, having a first input coupled to the frequency multiplier to receive the phase-modulated output signal, having a second input coupled to the digital-to-analog converter to receive the analog amplitude-modulated signal, the mixer for combining the multiplied phase-modulated output signal and the analog amplitude-modulated signal into a second mode output signal.

2. The circuit of claim 1, further comprising:
   a filter circuit, coupled between the digital-to-analog converter and the second input of the mixer.

3. The circuit of claim 1, wherein the modulation loop comprises a phase-locked loop, the phase-locked loop including a low-pass loop filter;
   and further comprising:
     a modulation compensation circuit, coupled to the compensation circuitry and to the modulation loop, for compensating the effects of the loop filter.

4. The circuit of claim 3, wherein the phase-locked loop further comprises:
   a phase detector, for comparing a feedback signal to a reference signal, the phase detector having an output coupled to the low-pass loop filter;
   a voltage-controlled oscillator, having a control input coupled to the low-pass loop filter, for generating the phase-modulated signal at an output; and
   a frequency divider, having an input coupled to the output of the voltage-controlled oscillator, for generating the feedback signal;
   wherein the modulation loop further comprises:
     a Σ-Δ modulator, having an input coupled to receive a sum of a channel frequency and the compensated input phase signal, and having an output coupled to a control input of the frequency divider;
   and wherein the modulation compensation circuit comprises:
     a phase demodulator, for demodulating the phase-modulated signal; and
     a comparator for comparing the demodulated phase-modulated signal to a signal based on the input phase signal, and for producing an error signal coupled to the input of the Σ-Δ modulator.

5. The circuit of claim 1, wherein the compensation loop comprises:
   a direct digital frequency synthesis circuit, receiving the compensated input phase signal and a channel frequency at respective inputs, and for generating an analog signal corresponding to a phase-modulation of the channel frequency;
   a phase-locked-loop circuit, having an input for receiving the analog signal from the direct digital frequency synthesis circuit, and for producing a phase-modulated signal at an output.

6. The circuit of claim 5, wherein the direct digital frequency synthesis circuit comprises:
   phase accumulator circuitry, for periodically combining a digital channel frequency word and a digital signal based on the input phase signal to produce a digital phase accumulator output sequence;
   a memory for producing a sine wave output sequence responsive to the phase accumulator output;
   a digital-to-analog converter, for converting the sine wave output sequence into an analog signal.

7. The circuit of claim 5, wherein the direct digital frequency synthesis circuit comprises:
   an accumulator for periodically accumulating a channel frequency word, the accumulator having an output corresponding to a most significant bit of the accumulator contents; and
   edge correction and noise shaping circuitry, having an input receiving a sequence of the most significant bit of the accumulator contents, for adjusting the spacing of bit values in the sequence to produce an output sequence coupled to the phase-locked loop circuit.

8. The circuit of claim 7, wherein the most significant bit of the accumulator contents corresponds to a carry bit.

9. The circuit of claim 1, wherein the phase-modulated signal is a Gaussian-Minimum-Shift-Keyed modulated signal.

10. A method of producing multiple-mode modulated signals, comprising the steps of:
    receiving an input phase signal and an input amplitude signal, each corresponding to a sequence of digital words;

modulating the input phase signal to produce an analog phase-modulated output signal;

multiplying the frequency of a signal based on the phase-modulated signal to produce a multiplied phase-modulated signal;

converting the input amplitude signal to an analog amplitude signal; and mixing the analog amplitude signal and the multiplied phase-modulated signal to produce an amplitude and phase modulated output signal.

11. The method of claim 10, wherein the modulating step comprises:

adding the input phase signal to a channel frequency signal;

modulating the added input phase signal and channel frequency signal using a Σ-Δ modulator, to produce a modulated output; and applying the modulated output to a frequency divider in a phase-locked-loop;

wherein the output of the phase-locked loop presents the analog-phase-modulated output signal.

12. The method of claim 11, further comprising:

phase-demodulating the analog phase-modulated signal;

comparing the phase-demodulated analog phase-modulated signal to a delayed version of the input phase signal to produce an error signal;

adding the error signal to the input phase signal so that the adding step adds the sum of the input phase signal and the error signal to the channel frequency signal.

13. The method of claim 10, wherein the modulating step comprises:

synthesizing a direct digital frequency from the input phase signal and a channel frequency signal;

converting the direct digital frequency to an analog synthesized signal;

applying the analog synthesized signal to a phase-locked loop to produce the analog phase-modulated signal.

14. The method of claim 10, wherein the synthesizing step comprises:

periodically adding the input phase signal to an accumulation of the channel frequency signal;

applying the result of the adding step to a sine wave table to produce a digital sine wave value.

15. The method of claim 10, wherein the synthesizing step comprises:

periodically accumulating a digital word corresponding to the channel frequency signal, to produce a bit sequence of a most significant bit of the accumulation; and correcting the bit sequence to more uniformly space bit values in the bit sequence.

16. The method of claim 10, wherein the phase-modulated output signal is a Gaussian-Minimum-Shift-Keyed modulated signal.

17. A wireless telephone device, comprising:

a microphone;

a speaker;

baseband circuitry, coupled to the microphone and speaker, to process audio signals received from and presented to the microphone and speaker, respectively;

polar modulator circuitry coupled to the baseband circuitry, for encoding signals from the baseband circuitry into phase and amplitude digital signals;

transceiver circuitry, comprising:

a phase modulator leg, comprising:

compensation circuitry for applying delay compensation to the phase digital signal;

a modulation loop, for receiving the compensated input phase signal and for producing a phase-modulated output signal as a first mode output signal; and a frequency multiplier, coupled to the modulation loop, for multiplying the frequency of the phase-modulated output signal;

an amplitude modulator leg, comprising:

a digital-to-analog converter, for converting the amplitude digital signal to an analog amplitude modulated signal; and a mixer, having a first input coupled to the frequency multiplier to receive the phase-modulated output signal, having a second input coupled to the digital-to-analog converter to receive the analog amplitude-modulated signal, the mixer for combining the multiplied phase-modulated output signal and the analog amplitude-modulated signal into a second mode output signal; and amplifier circuitry for amplifying the first mode output signal and the second mode output signal, for transmission via an antenna.

18. The device of claim 17, wherein the modulation loop comprises a phase-locked loop, the phase-locked loop including a low-pass loop filter;

and wherein the phase modulator leg of the transceiver circuitry further comprises:

a modulation compensation circuit, coupled to the compensation circuitry and to the modulation loop, for compensating the effects of the loop filter.

19. The device of claim 18, wherein the phase-locked loop further comprises:

a phase detector, for comparing a feedback signal to a reference signal, the phase detector having an output coupled to the low-pass loop filter;

a voltage-controlled oscillator, having a control input coupled to the low-pass loop filter, for generating the phase-modulated signal at an output; and a frequency divider, having an input coupled to the output of the voltage-controlled oscillator, for generating the feedback signal;

wherein the modulation loop further comprises:

a Σ-Δ modulator, having an input coupled to receive a sum of a channel frequency and the compensated phase digital signal, and having an output coupled to a control input of the frequency divider;

and wherein the modulation compensation circuit comprises:

a phase demodulator, for demodulating the phase-modulated signal; and a comparator for comparing the demodulated phase-modulated signal to a signal based on the phase digital signal, and for producing an error signal coupled to the input of the Σ-Δ modulator.

20. The device of claim 18, wherein the compensation circuit comprises:

a direct digital frequency synthesis circuit, receiving the compensated phase digital signal and a channel frequency at respective inputs, and for generating an analog signal corresponding to a phase-modulation of the channel frequency;

a phase-locked-loop circuit, having an input for receiving the analog signal from the direct digital frequency synthesis circuit, and for producing a phase-modulated signal at an output.

21. The circuit of claim 20, wherein the direct digital frequency synthesis circuit comprises:
    phase accumulator circuitry, for periodically combining a digital channel frequency word and a digital signal based on the phase digital signal to produce a digital phase accumulator output sequence;
    a memory for producing a sine wave output sequence responsive to the phase accumulator output;
    a digital-to-analog converter, for converting the sine wave output sequence into an analog signal.

22. The device of claim 20, wherein the direct digital frequency synthesis circuit comprises:
    an accumulator for periodically accumulating a channel frequency word, the accumulator having an output corresponding to a most significant bit of the accumulator contents; and
    edge correction and noise shaping circuitry, having an input receiving a sequence of the most significant bit of the accumulator contents, for adjusting the spacing of bit values in the sequence and applying a corresponding output signal to the phase-locked loop circuit.

23. The device of claim 20, wherein the most significant bit of the accumulator contents corresponds to a carry bit.

* * * * *